United States Patent [19]
La et al.

[11] Patent Number: 5,780,204
[45] Date of Patent: Jul. 14, 1998

[54] BACKSIDE WAFER POLISHING FOR IMPROVED PHOTOLITHOGRAPHY

[75] Inventors: Tho Le La, San Jose; Subramanian Venkatkrishnan; Mark T. Ramsbey, both of Sunnyvale; Jack F. Thomas, Palo Alto; Kathleen Early, Santa Clara, all of Calif.

[73] Assignee: Advanced Micro Devices, Inc., Sunnyvale, Calif.

[21] Appl. No.: 790,886

[22] Filed: Feb. 3, 1997

[51] Int. Cl.$^6$ .................... G03C 5/00; G03F 7/00
[52] U.S. Cl. .................... 430/312; 430/320; 430/331
[58] Field of Search .................... 430/320, 331, 430/312, 327

[56] References Cited

U.S. PATENT DOCUMENTS

| | | | |
|---|---|---|---|
| 3,911,562 | 10/1975 | Youmans | 29/590 |
| 4,944,836 | 7/1990 | Beyer et al. | 156/645 |
| 5,093,279 | 3/1992 | Andreshak et al. | 437/173 |
| 5,245,794 | 9/1993 | Salugsugan | 51/165.74 |
| 5,262,354 | 11/1993 | Cote et al. | 437/195 |
| 5,424,224 | 6/1995 | Allen et al. | 437/10 |
| 5,442,828 | 8/1995 | Lutz | 15/88.3 |
| 5,552,326 | 9/1996 | Frank et al. | 437/3 |

FOREIGN PATENT DOCUMENTS 6168958  6/1994  Japan

OTHER PUBLICATIONS

Joshi, "A New Damascene Structure for Submicrometer Interconnect Wiring," IEEE Electron Device Letters, vol. 14, No. 3, Mar. 1993, pp. 129–132.

Kaanta et al., "Dual Damascene: A ULSI Wiring Technology," Jun. 11–12, 1991, VMIC Conference, IEEE, pp. 144–152.

Kenney et al., "A Buried–Plate Trench Cell for a 64–Mb DRAM," 1992 Symposium on VLSI Technology Digest of Technical Papers, IEEE, pp. 14–15.

Primary Examiner—Janet C. Baxter
Assistant Examiner—Rosemary Ashton

[57] ABSTRACT

The accuracy of photolithographic processing, particularly in forming small diameter through holes and/or trenches in a dielectric layer, is improved by polishing the wafer backside prior to photolithography. It was found that particles adhering to and/or scratches on the wafer backside resulting from prior processing steps cause inaccurate photolithographic processing, particularly at a submicron level. Backside polishing, as by chemical-/mechanical polishing, removes such adhering particles and/or scratches, thereby improving photolithographic accuracy.

22 Claims, 1 Drawing Sheet

BACKSIDE WAFER POLISHING FOR IMPROVED PHOTOLITHOGRAPHY

TECHNICAL FIELD

The present invention relates to a method of manufacturing a semiconductive device comprising submicron design features, such as transistors, contacts, vias and conductive lines. The present invention is particularly applicable for producing high speed integrated circuits.

BACKGROUND ART

Conventional semiconductor devices comprise a semiconductor wafer, normally monocrystalline silicon, and a plurality of sequentially formed dielectric layers and conductive layers on the wafer frontside, with integrated circuitry containing a plurality of conductive patterns comprising spaced apart conductive lines, and a plurality of interconnect lines, such as bus lines, bit lines, word lines and logic interconnect lines. Typically, conductive patterns in different layers, i.e., upper and lower layers, are electrically connected by conductive vias; while electrical connection to an active region on the frontside of the wafer is effected by a contact hole filled with conductive material, such as a metal.

Conductive vias and contacts are typically formed by depositing a dielectric layer, forming an opening therethrough by conventional photolithographic and etching techniques, and filling the opening with a conductive material, such as tungsten. One such method is known as damascene and basically involves the formation of an opening which is filled in with a metal, such as tungsten, to form an interconnecting contact or via plug. Damascene techniques are also conventionally employed to form conductive patterns of closely spaced apart conductive lines by employing photolithographic and etching techniques to form a plurality of trenches, for example, substantially horizontal trenches, in a dielectric layer, which trenches are subsequently filled with a metal. In copending application Ser. No. 08/320,516 filed on Oct. 11, 1994, prior art single and dual damascene techniques are disclosed, in addition to several improved dual damascene techniques for greater accuracy in forming fine line patterns with minimal interwiring spacings. The entire disclosure of copending application Ser. No. 08/320,516 is incorporated herein by reference.

Conventional practices for forming vias and contacts by etching an opening through a dielectric layer and filling the opening with a metal involve complicated manipulative steps and are attendant with numerous disadvantages. Various problems stem from photolithographic techniques to form openings, etching and filling the openings, particularly in forming openings with submicron dimensions to satisfy increased densification requirements and performance in ultra-large scale integration semiconductor technology. Such problems lead to unreliable electrical contact, lower operating speeds and poor signal-to-noise ratios.

As the design requirements for interconnection patterns become more severe, requiring increasingly smaller dimensions for through holes, conductive line widths and interwiring spacings, such as less than about 0.30 µm, particularly less than about 0.25 µm, the ability of conventional photolithographic techniques to satisfy such demands with satisfactory accuracy becomes increasingly more difficult. The limitation on achieving such fine dimensions resides in the inability of conventional photolithographic and etching techniques to satisfy the accuracy requirement for such fine patterns.

In forming patterns having a small dimension, such as about 0.30 to about 0.40 µm or greater, I-line photolithography is conventionally employed. As the maximum dimension is reduced, e.g., to below about 0.30 µm, such as less than about 0.25 µm, it is necessary to resort to shorter wavelengths, such as deep ultra-violet light. It is, however, very difficult to form fine line patterns with a maximum dimension of about 0.30 µm or less with any reasonable degree of accuracy, consistency and efficiency. Thus, there is a need for reducing photolithographic failure, particularly in printing contact holes and vias having a submicron dimension below about 0.30 µm, particularly below 0.25 µm.

DISCLOSURE OF THE INVENTION

An object of the present invention is a method of manufacturing a semiconductive device comprising transistors, contacts, vias and/or conductive lines with submicron dimensions.

Another object of the present invention is a method of manufacturing a semiconductive device having an a submicron interconnect structure with reduced photolithographic failure.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects were achieved in part by a method of manufacturing a semiconductive device, which method comprises: providing a wafer having a frontside and a backside; forming elements on the frontside of the wafer; and polishing the backside of the wafer during manufacturing.

A further aspect of the present invention is a method of manufacturing a semiconductive device, which method comprises sequentially: providing a wafer having a frontside and a backside; depositing a dielectric layer on the frontside of the wafer; polishing the backside of the wafer by chemical-mechanical polishing; forming a photoresist mask on the dielectric layer by a photolithographic technique; and etching the underlying dielectric layer.

Another aspect of the present invention is a method of manufacturing a semiconductor device, which method comprises sequentially: providing a wafer having a frontside and a backside; depositing a dielectric layer on the frontside of the wafer; chemical-mechanical polishing the backside of the wafer; forming a photoresist mask on the dielectric layer by a photolithographic technique; etching the underlying dielectric layer to form through holes and/or a plurality of substantially horizontally extending trenches therein; and filling the through holes and/or trenches with a conductive material.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
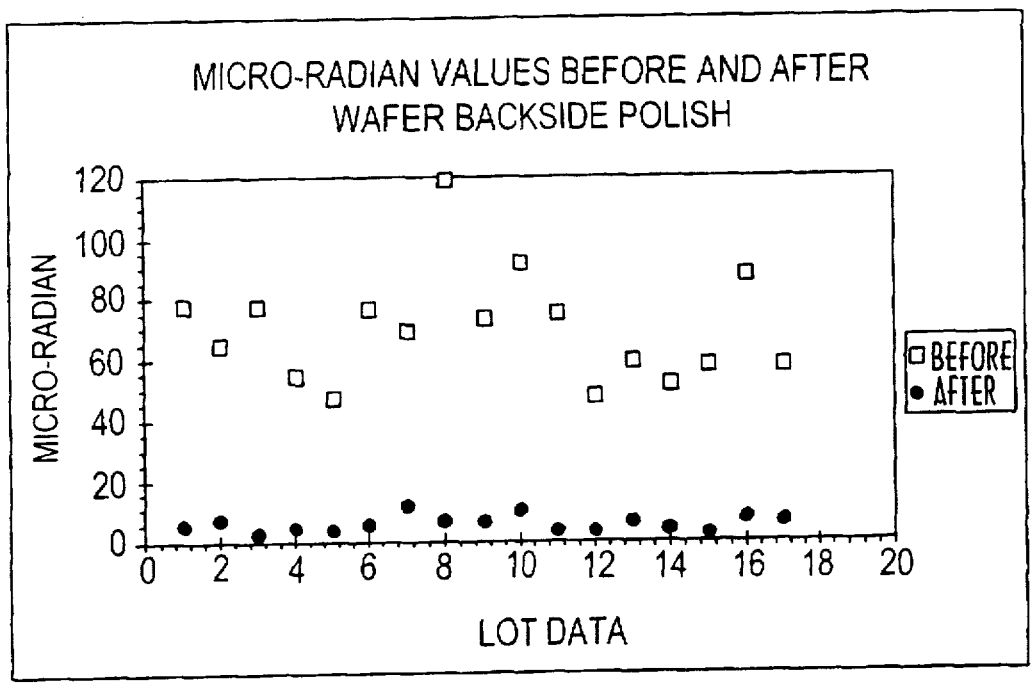
FIG. 1 is a plot of experimental data demonstrating the advantages of the present invention.

The present invention addresses the problem of photolithographic failure in printing through holes and trenches for forming contacts, vias and conductive lines having minimal dimensions, such as a maximum dimension less than about 0.30 microns, particularly less than about 0.25 microns. Upon extensive investigation of various photolithographic failures in printing through holes having minimal dimensions, it was found that the photolithographic stepper was employing tilts ranging from 40 to 100 microradians to compensate for measured wafer non-flatness. Such photolithographic failures typically include incomplete formation of a through hole and failure to form an opening at all resulting in a missing contact or via. Conventional photolithographic steppers tilt the exposure field to bring the entire exposure field within the stepper focal plane. However, while investigating photolithographic failures, it was found that for a 2×2 cm$^2$ field, the tilt numbers of 40 to 100 microradians correspond to 0.8 to 2.5 μm of z-height variation. These numbers are quite high compared with the stepper usable depth-of-focus, which is only about 0.6 microns for the involved masking levels. Such high tilt numbers strongly correlate with defective die locations.

Upon further extensive investigation and experimentation, it was found that micro-particles are unintentionally deposited on and/or adhered to the backside of a wafer during a previous processing step. It was also found that micro-scratches are formed in the backside of the wafer during handling steps. Such micro-defects on the backside of the wafer are believed to be result from transfer tools or processing equipment. Such wafer handling and, hence, backside exposure is extremely difficult to avoid during conventional semiconductor processing. It was further found that stepper induced tilting cannot compensate for such micro-defects, e.g., micro-bumps, hillocks and/or scratches, on the wafer backside, because stepper induced tilting can only fit a flat plane.

The present invention stems from the discovery that contaminants, such as particulate material, adhering to, and/or scratches on, the backside of a conventional semiconductor wafer resulting from previous handling and/or processing steps are largely responsible for photolithographic failure in printing minimal dimension through holes or conductive lines, e.g., less than about 0.30 μm, particular less than 0.25 μm. The present invention addresses and solves that problem in a cost-effective and efficient manner utilizing existing production equipment. The solution to the photolithographic failure problem encompassed by the present invention resides in polishing the backside of the wafer, particularly at strategic times during the manufacturing process, such as subsequent to deposition of a dielectric layer and/or prior to photomasking, to improve wafer flatness by substantially removing backside micro-defects, such as micro-particles, hillocks and/or scratches.

In co-pending application Ser. No. 08/800,940 filed on Mar. 13, 1997 (Our Docket No. 1033-221), a method is disclosed for reducing photolithographic failures by performing a double sided wafer scrubbing operation, particularly subsequent to deposition of a dielectric layer and/or prior to photolithographic processing. However, the present invention comprises a more severe approach by polishing the wafer backside, as by chemical-mechanical polishing, to effect substantially complete removal of wafer backside micro-defects. Thus, in accordance with the present invention, a significant reduction in photolithographic failure due to wafer backside micro-defects is realized.

In an embodiment of the present invention, backside polishing is effected by chemical-mechanical-planarization or polishing (CMP). As CMP is a conventional planarization technique, the details of conventional CMP techniques are not set forth herein in detail. Basically, in employing a conventional CMP apparatus, wafers to be polished are mounted on a carrier assembly placed on the CMP apparatus. A polishing pad is adapted to engage the wafers carried by the carrier assembly. A chemical agent containing an abrasive, typically a slurry, is dripped onto the pad during the polishing operation while pressure is applied to the wafer via the carrier assembly. Known CMP techniques are disclosed by Salugsugan, U.S. Pat. No. 5,245,749; Beyer et al. U.S. Pat. No. 4,944,836; and Youmans, U.S. Pat. No. 3,911,562, the entire disclosures of which are incorporated herein by reference in their entirety.

In an embodiment of the present invention, CMP is conducted on the wafer backside during the semiconductor manufacturing process, particularly subsequent to depositing a dielectric layer and/or prior to subsequent photolithography, to provide a wafer backside with a suitable wafer flatness, i.e., a wafer flatness wherein the maximum distance between a high and low region within a stepper field, e.g., 2×2 cm$^2$, is less than or equal to the minimum feature size within that stepper field, i.e., line width or opening diameter, such as less than about 0.30 μm. Conventional semiconductor manufacturing methodology comprises planarizing with CMP after metal deposition to fill an opening and/or trench in a dielectric layer, or after forming a metal pattern on the wafer frontside. However, in accordance with the present invention, CMP is strategically performed on the wafer backside, preferably immediately after deposition of a dielectric layer and immediately prior to formation of a photomask on the dielectric layer.

According to the present invention, methodology, conventionally employed in fabricating a semiconductive device is conducted, including conventional deposition techniques, using conventional materials and employing conventional processing equipment. However, in accordance of the present invention, photolithographic failures are dramatically reduced by polishing the wafer backside, particularly at various strategic stages during the manufacturing process. For example, in an embodiment of the present invention, a through hole is formed in a dielectric layer on the frontside of a semiconductor wafer, which through hole is then filled with conductive material, such as a metal, e.g., tungsten, to form a contact or plug electrically connected to an active region of the semiconductive wafer frontside, such as a source/drain region, or a conductive via electrically interconnecting conductive patterns on different levels of the semiconductor device.

This embodiment of the present invention comprises depositing a dielectric layer on the semiconductor wafer frontside, and then polishing the wafer backside, as by CMP, preferably immediately subsequent to depositing the dielectric layer and immediately prior to subsequently forming a photoresist mask on the dielectric layer. A photoresist mask, such as a contact photoresist mask, is then formed on the dielectric layer, preferably without performing any intervening processing step. For example, immediately after wafer backside polishing, a layer of photoresist material is deposited on the dielectric layer and processed in accordance with any of various conventional photolithographic techniques to form a contact photoresist mask. As a result of wafer backside polishing in accordance with the present invention, micro-defects, such as micro-particles, hillocks and/or scratches, on the backside surface of the semiconductive wafer are removed, thereby dramatically reducing photolithographic failure, particularly in forming minimal dimension through holes and/or trenches, such as less than about 0.30 μm, e.g., less than about 0.25 μm.

In another embodiment of the present invention, wafer backside polishing is performed to reduce photolithographic failure in forming a conductive via between conductive patterns on different levels of a integrated semiconductive device. For example, after forming a contact or plug in electrical contact with an active region on the wafer frontside, a conductive pattern is formed on a dielectric layer and a second dielectric layer is deposited on the conductive pattern. Wafer backside polishing is performed, preferably immediately subsequent to depositing the second dielectric layer and/or immediately before forming a photoresist mask on the second dielectric layer. The photoresist mask is typically formed by depositing a layer of photoresist material and performing any of various conventional photolithographic techniques. The second dielectric layer is then etched through the photoresist mask to form a through hole which is filled with a conductive material, such as a metal, e.g. tungsten, to form a conductive via in electrical contact with the underlying conductive pattern.

The present invention enjoys utility in forming conductive patterns comprising a plurality of closely spaced apart fine conductive lines by damascene techniques. In accordance with an embodiment of the present invention, a dielectric layer is deposited on the frontside of a semiconductor wafer and the wafer backside is polished, preferably immediately thereafter. A photoresist material is then deposited on the dielectric layer and a photoresist mask formed defining a conductive pattern comprising a plurality of closely spaced apart fine conductive lines, preferably substantially horizontal trenches, with or without openings for vias, i.e., a conventional single or dual damascene technique. The underlying dielectric layer is then etched through the photoresist mask to form a plurality of trenches, e.g., substantially horizontally extending trenches, which trenches are then filled with conductive material, such as metal, to form a conductive pattern comprising a plurality of closely spaced apart fine conductive lines having a maximum dimension, e.g., line width and/or interwiring spacing, less than about 0.30 μm, including less than about 0.25 μm.

Wafer backside polishing in accordance with the present invention, as by CMP, removes any particulate contaminants from and/or scratches in the wafer backside, thereby significantly reducing photolithographic failures. Wafer backside polishing is performed at various strategic times during the semiconductor device manufacturing process, particularly after depositing a dielectric layer on the wafer frontside and/or prior to forming a photoresist mask on the deposited dielectric layer by photolithographic techniques, preferably immediately prior to photolithographic processing on the frontside, thereby dramatically reducing photolithographic failure.

In an aspect of the present invention, CMP is performed to effect planarization of the wafer backside to minimize backside sub-defects. In planarizing the wafer backside, it has been found suitable to achieve a wafer flatness such that the maximum distance between a high and low region within a stepper field, e.g., 2×2 cm², is less than or equal to the minimum feature size within that stepper field, i.e., line width or opening diameter, such as less than about 0.30 μm.

One having ordinary skill in the art can easily optimize the relevant polishing parameters in a given situation to effect sufficient wafer flatness or achieve a desired degree of sub-defect removal to improve photolithographic accuracy, e.g., CMP pad rotation speed, pressure and duration.

EXAMPLE

A plurality of silicon semiconductive wafers were processed employing identical processing steps, material and equipment, except that CMP was performed on the backside of one group of wafers subsequent to depositing a dielectric layer on the wafer frontside and before forming a photoresist mask on the dielectric layer, employing a conventional photolithographic technique. CMP was conducted at a pressure of about 6 to about 10 psi, at a polishing pad rotation rate of about 30 rpm to about 60 rpm, for about 1 to about 2 minutes, during which time an abrasive slurry was dripped onto the polishing pad. The resulting wafer backside surface exhibited a wafer flatness wherein the maximum distance between the high and low region within a stepper field of 2×2 cm² was less than about 0.30 μm. Through holes were then etched in the dielectric layer through the photoresist mask, which through holes had a diameter no greater than about 0.30 μm. The through holes were then filled with tungsten employing a conventional vapor deposition technique. All wafers were then subjected to testing by a method called Level-Control (LC) diagnostics on an ASML stepper, which provides measurements of tilt in terms of microradian values. The results are set forth in Table I below and plotted in FIG. 1.

TABLE I

| ASM LCD (micro-radian values) for wafer backside polish | | |
|---|---|---|
| Before | After | % difference (improvement) |
| 78 | 5 | 93.6 |
| 64 | 7 | 89.1 |
| 77 | 2 | 97.4 |
| 54 | 4 | 92.6 |
| 47 | 3 | 93.6 |
| 76 | 5 | 93.4 |
| 69 | 11 | 84.1 |
| 119 | 6 | 95.0 |
| 73 | 6 | 91.8 |
| 92 | 10 | 89.1 |
| 75 | 3 | 96.0 |
| 48 | 3 | 93.8 |
| 59 | 6 | 89.8 |
| 52 | 4 | 92.3 |
| 58 | 2 | 96.6 |
| 88 | 8 | 90.9 |
| 58 | 7 | 87.9 |

It is apparent that wafer backside polishing in accordance with the present invention dramatically reduced the compensatory stepper tilt numbers Rx and Ry by about 90%. Such a dramatic reduction to in stepper tilt numbers translates to a commensurate reduction in photolithographic failures, thereby significantly reducing manufacturing costs and increasing device reliability.

The present invention can be practiced employing otherwise conventional CMP techniques and apparatus. For example, the CMP apparatus disclosed in the previously mentioned Salugsugan, Beyer et al. and Youmans patents can be employed for wafer backside CMP in practicing the present invention on various wafers, particularly silicon wafers. The dielectric and conductive materials employed in the present invention are those conventionally employed in manufacturing semiconductor devices. For example, the dielectric materials include oxides, such as silicon oxide, and nitrides, such as silicon nitrides, as well as silicon oxynitrides. The dielectric layers of the present invention also include conventional dielectric layers of silicon oxide formed by depositing tetraethyl orthosilicate (TEOS), thermolosilicidation of a deposited silicon layer, PECVD, thermo enhanced CVD and spin on techniques.

Conductive materials generally include doped polysilicon, aluminum, aluminum alloys, copper, copper alloys, and refractory metals, such as tungsten, titanium, and compounds and alloys thereof. In forming interconnects, conventional barrier layers and anti-reflective coatings can also be employed.

The dielectric layers and metal layers utilized in manufacturing a semiconductor device in accordance with the present invention can be deposited by conventional deposition techniques. For example, metallization techniques, such as various types of chemical vapor deposition (CVD) processes, including low pressure chemical vapor deposition (LPCVP) and enhanced chemical vapor deposition (ECVD) can be employed. Normally, when high melting point metals are deposited, CVP techniques are employed. Low melting point metals, such as aluminum and aluminum-based alloys, including aluminum-copper alloys, can be deposited by melting, reflow or sputtering. Polycrystalline silicon can also be employed as a conductive material in an interconnection pattern.

Various embodiments of the present invention comprise forming openings in a dielectric layer employing conventional photolithographic and etching techniques, including forming and using a conventional photoresist mask, etch recipes, and etching techniques as, for example, plasma or reactive ion etching.

The present invention provides an efficient, cost-effective manufacturing technique which significantly reduces photolithographic failure in forming minimal dimension contacts/vias and conductive patterns, particularly those having a maximum dimension less than about 0.30 µm, e.g., less than about 0.25 µm. The present invention provides methodology yielding semiconductive devices having increased operating speeds with improved reliability, precision, accuracy, efficiency, wear characteristics and signal-to-noise ratios.

Only the preferred embodiments of the invention and but a few examples of its versatility are shown and described in the present disclosure. It is to be understood that the invention is capable of use in various other combinations and environments and is capable of changes or modifications within the scope of the inventive concept as disclosed herein.

We claim:

1. A method of manufacturing a semiconductor device, which method comprises sequentially:
    depositing at least one dielectric layer on a frontside of a wafer, which wafer has a backside opposite the frontside;
    polishing the backside of the wafer; and
    performing a photolithographic technique on the dielectric layer.

2. The method according to claim 1, wherein: said photolithographic technique on the dielectric layer comprises forming a hole and/or trench; and said polishing the backside of the wafer is performed before said photolithographic technique.

3. The method according to claim 2, comprising polishing the backside of the wafer by chemical-mechanical polishing.

4. The method according to claim 2, wherein said photolithographic technique on the dielectric layer comprises:
    forming a photoresist mask on the dielectric layer subsequent to said backside polishing; and
    etching the dielectric layer through the photoresist mask to form at least one through hole and/or trench in the dielectric layer.

5. The method according to claim 4, wherein said etching comprises:
    etching the dielectric layer to form a contact hole exposing an active region on the frontside of the wafer;
    said method further comprising filling the contact hole with conductive material after performing said photolithographic technique.

6. The method according to claim 5, wherein the contact hole has a diameter less than about 0.30 µm.

7. The method according to claim 4, further comprising forming a conductive pattern on the dielectric layer subsequent to said etching.

8. The method according to claim 7, further comprising sequentially:
    depositing a second dielectric layer on the conductive pattern;
    polishing the backside of the wafer;
    depositing a photoresist layer on the second dielectric layer;
    forming a photoresist mask by a photolithographic technique;
    etching the second dielectric layer to form at least one through hole and/or trench therein.

9. The method according to claim 8, comprising:
    etching the second dielectric layer to form a through hole therein; and
    filling the through hole with conductive material to form a conductive via in electrically contact with the underlying conductive pattern.

10. The method according to claim 9, wherein the through hole has a diameter less than about 0.30 µm.

11. The method according to claim 8, comprising backside wafer polishing after depositing the second dielectric layer to a wafer flatness wherein the maximum distance between a high and low region within a stepper field used during the photolithographic technique is no greater than the minimum feature size within the stepper field.

12. The method according to claim 2, wherein said photolithographic technique on said dielectric layer comprises etching the dielectric layer to form a plurality of trenches extending in a substantially horizontal direction; said method further comprising:
    filling the trenches with conductive material to form a plurality of conductive lines of a conductive pattern separated by an interwiring spacing after said photolithographic technique.

13. The method according to claim 12, wherein the conductive material is a metal.

14. The method according to claim 12, wherein the width of the trenches and/or interwiring spacing is less than about 0.30 microns.

15. The method according to claim 2, wherein said polishing comprises chemical-mechanical polishing the wafer backside to a wafer flatness wherein the maximum distance between a high and low region within a stepper field of 2×2 cm$^2$ is less than about 0.30 µm.

16. The method according to claim 2, further comprising sequentially:

depositing a metal layer on the dielectric layer;

polishing the backside of the wafer;

depositing a layer of photoresist material on the metal layer;

forming a photoresist mask by a photolithographic technique; and etching the underlying metal layer to form a conductive pattern comprising the plurality of conductive lines with an interwiring spacing therebetween.

17. The method according to claim 16, comprising backside wafer polishing to a wafer flatness wherein the maximum distance between a high and low region within a stepper field used during the photolithographic technique is no greater than the minimum feature size within the stepper field.

18. The method according to claim 2, comprising backside wafer polishing to a wafer flatness wherein the maximum distance between a high and low region within a stepper field used during the photolithographic technique is no greater than the minimum feature size within the stepper field.

19. The method according to claim 1, comprising polishing the backside of the wafer by chemical-mechanical polishing.

20. The method according to claim 1, wherein:

said polishing the backside comprises chemical-mechanical polishing; and said photolithographic technique comprises:

depositing a photoresist material on the dielectric layer;

forming a photoresist mask by a photolithographic technique; and etching the underlying dielectric layer through the photoresist mask to form at least one through hole and/or trench having a sub-micron dimension.

21. The method according to claim 20, comprising a chemical-mechanical polishing the wafer backside to a wafer flatness wherein the maximum distance between a high and low region within a stepper field used during the photolithographic technique is no greater than the minimum feature size within the stepper field.

22. The method according to claim 1, comprising polishing the backside of the wafer to remove any adhering particles and/or scratches.

* * * * *